United States Patent
Chai

(10) Patent No.: US 9,912,279 B2
(45) Date of Patent: Mar. 6, 2018

(54) CIRCUIT WITH CURRENT SHARING ALTERNATELY SWITCHED PARALLEL TRANSISTORS

(71) Applicant: Hamilton Sundstrand Corporation, Charlotte, NC (US)

(72) Inventor: Huazhen Chai, Caledonia, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 14/809,825

(22) Filed: Jul. 27, 2015

(65) Prior Publication Data
US 2017/0033721 A1   Feb. 2, 2017

(51) Int. Cl.
| | | |
|---|---|---|
| *H02P 27/04* | (2016.01) | |
| *H02P 27/06* | (2006.01) | |
| *H03K 17/12* | (2006.01) | |
| *H03K 17/567* | (2006.01) | |
| *H02M 7/537* | (2006.01) | |
| *H02M 7/5387* | (2007.01) | |
| *H03K 17/08* | (2006.01) | |
| *H02M 7/48* | (2007.01) | |
| *H02M 1/088* | (2006.01) | |
| *H02M 7/493* | (2007.01) | |

(52) U.S. Cl.
CPC ............ *H02P 27/06* (2013.01); *H02M 7/537* (2013.01); *H02M 7/5387* (2013.01); *H03K 17/127* (2013.01); *H03K 17/567* (2013.01); *H02M 1/088* (2013.01); *H02M 7/493* (2013.01); *H02M 2007/4822* (2013.01); *H03K 2017/0806* (2013.01)

(58) Field of Classification Search
CPC . B60L 11/1803; Y02T 10/7005; B60W 10/08; H02P 27/08
USPC .................................. 318/139, 798, 800, 801
See application file for complete search history.

(56) References Cited

U.S. PATENT DOCUMENTS

| | | | |
|---|---|---|---|
| 3,699,358 A | | 10/1972 | Wilkinson |
| 4,491,768 A | * | 1/1985 | Slicker ................ B60L 11/1803 318/139 |
| 4,616,142 A | | 10/1986 | Upadhyay et al. |
| (Continued) | | | |

FOREIGN PATENT DOCUMENTS

| | | |
|---|---|---|
| DE | 102007063434 A1 | 1/2009 |
| EP | 1137160 A2 | 9/2001 |
| | (Continued) | |

OTHER PUBLICATIONS

European Search Report for Application No. 16181441.3-1805, dated Jan. 3, 2017, 10 Pages.

*Primary Examiner* — Rina Duda
(74) *Attorney, Agent, or Firm* — Cantor Colburn LLP

(57) ABSTRACT

A method of operating parallel connected transistors including a first transistor and a second transistor having their respective collectors and emitters connected together includes receiving a first pulse and providing it for a first time period to a gate of the first transistor and not to the second transistor. The method also includes receiving a second pulse and providing it for a second time period to a gate of the second transistor and not to the first transistor and receiving a third pulse and providing it to the gate of the first transistor and not to the second transistor for the first time period.

12 Claims, 6 Drawing Sheets

(56) References Cited

U.S. PATENT DOCUMENTS

| | | | |
|---|---|---|---|
| 5,172,310 A * | 12/1992 | Deam | H01L 23/52 |
| | | | 257/E23.141 |
| 5,434,771 A | 7/1995 | Danby et al. | |
| 5,561,595 A * | 10/1996 | Smith | H02M 1/4241 |
| | | | 363/132 |
| 6,597,157 B1 | 7/2003 | Boeckmann et al. | |
| 6,822,503 B2 | 11/2004 | Jang et al. | |
| 7,253,540 B1 | 8/2007 | Thalheim et al. | |
| 8,054,032 B2 * | 11/2011 | Chakrabarti | B60L 11/1868 |
| | | | 180/65.1 |
| 8,115,433 B2 * | 2/2012 | Welchko | B60L 11/1803 |
| | | | 318/400.11 |
| 8,830,711 B2 | 9/2014 | Lai et al. | |
| 8,941,264 B2 | 1/2015 | Scruggs et al. | |
| 2004/0252430 A1 | 12/2004 | Oumaru et al. | |
| 2007/0205727 A1 | 9/2007 | Tamita et al. | |
| 2009/0033255 A1 * | 2/2009 | John | B60L 11/1868 |
| | | | 318/139 |
| 2013/0141952 A1 | 6/2013 | Kaneko | |
| 2014/0112037 A1 | 4/2014 | Langhans et al. | |

FOREIGN PATENT DOCUMENTS

| | | | |
|---|---|---|---|
| EP | 0664613 | B1 | 2/2002 |
| WO | 2010121540 | A1 | 10/2010 |

\* cited by examiner

US 9,912,279 B2

CIRCUIT WITH CURRENT SHARING ALTERNATELY SWITCHED PARALLEL TRANSISTORS

BACKGROUND OF THE INVENTION

The present disclosure relates generally switches and, more particularly, to a circuit that drives a motor or other device utilizing parallel IGBT switches.

Insulated-gate bipolar transistors (IGBTs) are well known three-terminal power semiconductor devices. Due to their high efficiency and fast switching they are often used for switches primarily used as an electronic switch and can be used, for example, in inverters that convert a direct current (DC) voltage into an alternating current (AC) voltage.

In some cases a particular IGBT may not, due to thermal constraints, be able to handle the voltage/current required in a particular situation. One approach is to use two IGBTs in parallel to handle higher current. Such an approach would reduce thermal stress effects and add to the modularity of a particular system. In such cases, two parallel connected IGBTs are driven by a common or separate gate drives.

Paralleled IGBTs requires very careful design and layout of the IGBTs and busbars, requires effective heatsink to avoid thermal runaway, and careful design of gate drive to minimize the unequal current sharing during switching as well as steady state. With the prior art direct paralleling technologies, even with carefully lay out busbars and gate drives, it is not easy to achieve close to ideal steady state current sharing. Further, dynamic current sharing during turning-on and turning-off can be much worse.

Newer generations of IGBTs are switching ever faster. This means the dynamic sharing between paralleled IGBTs is getting more challenging, and the capacity utilization of paralleled IGBT is getting worse. For instance, In a six IGBT inverter bridge, the mismatch between current sharing, especially the dynamic sharing, differs between the three phase libs, and differs between upper and lower switches due to physical location differences of each IGBTs. The effective current capacity of the inverter would be dictated by the pair of paralleled IGBTs that has the worst sharing.

BRIEF DESCRIPTION OF THE INVENTION

According to one embodiment, an inverter that includes at least six sets of parallel connected transistors including a first set and a second set is disclosed. The first set has their collectors connected to an input line adapted for connection to a DC voltage source and their collectors connected to a phase output line, the second set having their emitters connected to a phase output line and their collectors connected to a DC voltage return line adapted for connection to the direct current voltage source. The inverter of this embodiment includes a controller that: receives for the first set a first pulse and provides it for a first time period to a gate of a first transistor of the first set and not to a second transistor of the first set and that receives a second pulse for the first set and provides it for a second time period to a gate of the second transistor of the first set and not to the first transistor of the first set; and receives for the second set a first pulse and provides it for a third time period to a gate of a first transistor of the second set and not to a second transistor of the second set and that receives a second pulse for the second set and provides it for a fourth time period to a gate of the second transistor of the second set and not to the first transistor of the second set.

In another embodiment, motor controller is disclosed. The motor controller includes at least six sets of parallel connected transistors including a first set and a second set is disclosed. The first set has their collectors connected to an input line adapted for connection to a DC voltage source and their collectors connected to a phase output line, the second set having their emitters connected to a phase output line and their collectors connected to a DC voltage return line adapted for connection to the direct current voltage source. The inverter of this embodiment includes a controller that: receives for the first set a first pulse and provides it for a first time period to a gate of a first transistor of the first set and not to a second transistor of the first set and that receives a second pulse for the first set and provides it for a second time period to a gate of the second transistor of the first set and not to the first transistor of the first set; and receives for the second set a first pulse and provides it for a third time period to a gate of a first transistor of the second set and not to a second transistor of the second set and that receives a second pulse for the second set and provides it for a fourth time period to a gate of the second transistor of the second set and not to the first transistor of the second set.

In another embodiment, a method of operating parallel connected transistors including a first transistor and a second transistor having their respective collectors and emitters connected together is disclosed. The method includes: receiving a first pulse and providing it for a first time period to a gate of the first transistor and not to the second transistor; receiving a second pulse and providing it for a second time period to a gate of the second transistor and not to the first transistor; and receiving a third pulse and providing it to the gate of the first transistor and not to the second transistor for the first time period.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Embodiments described herein relate to an IGBT control scheme that may achieve higher current capability with paralleled IGBTs by alternate switching of paralleled IGBTs. It has been discovered that for applications where IGBT size is dictated by thermal conditions (such as aerospace applications) unequal current sharing of paralleled IGBTs can result in a 15% to 30% of IGBT current capacity reduction. By switching the current alternately through each of the two paralleled IGBTs as described herein, the conduction and switch losses may be reduced. In one embodiment, as the losses on each IGBT would be close to equal, an additional 15% to 30% IGBT current capacity compared to direct paralleled IGBTs may be realized.

In majority of industrial applications and almost all aerospace applications, the IGBT size is determined by IGBT thermal limit, or indirectly the IGBT losses. The reduction in IGBT capacity utilization from unequal current sharing is indeed due to unequal loss sharing. IGBT total loss is the sum of conduction loss and switching loss. To a first order of approximation, the IGBT conduction loss is proportional to current and on-time. Similarly the switching losses are proportional to current and switching frequency.

Figure 1A:
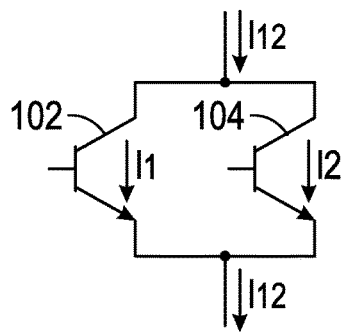
FIGS. 1A and 1B show, respectively, paralleled IGBT's and a timing diagram of how such IGBT's may be operated in the prior art.
Figure 1B:
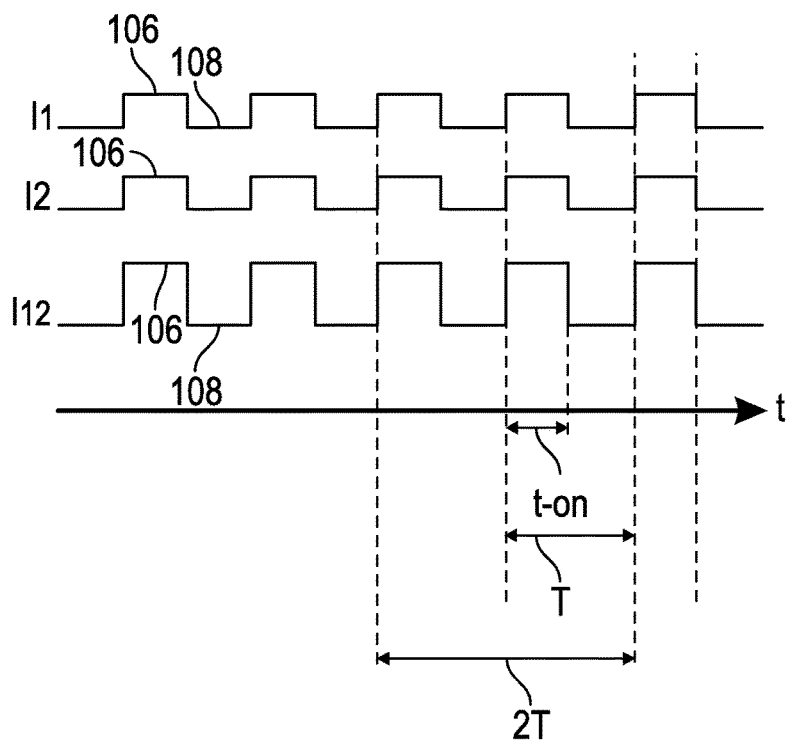

FIGS. 1A and 1B, show, respectively, an ideal pair of paralleled IGBTs 101, 102 and a prior art timing diagram showing the current through each transistor as well as when that current flows. The time the current flows (e.g., peaks 106) corresponds to when the gate of each IGBT is receiving a sufficiently high "turn-on" voltage.

In more detail, the IGBT's 102/104 are turned "on" and "off" simultaneously at the frequency (f), and each switch would carry half of the total current $I_{12}/2$) for the complete on-time (t-on) both steady and dynamically, hence each IGBT would generate half of the total conduction losses and switching losses. In FIG. 1A, T denotes a period at a particular frequency f. Over a two periods (2T) each IGBT allows current to pass twice for a total on time to 2 t-on with a current of approximately ½ $I_{12}$.

Embodiments disclosed herein provide a different switching pattern for the paralleled IGBT's 102/104. It shall be understood that while embodiments disclosed herein refer to IGBT's, the same patterns/algorithms could be applied for any type of switch (bipolar transistor, field effect transistors etc) either now existing or later developed where a control signal (e.g. gate voltage, base current etc) controls conduction through a device. In one embodiment, the two paralleled IGBTs are switched alternately, ie., each IGBT is turned on every other pulses, each IGBT would be conducting the total current $I_{in}$ but for half of the on-time, and at half of the switching frequency, therefore each IGBT would still generate half of the total loss. This is the same as that of an ideal paralleled pair of IGBTs. In addition to maximizing the IGBT capacity, the alternate switching forces an equal average current through each IGBT regardless of IGBT switching parameter variations, positive or negative thermal co-efficient or layout non-symmetry. So inherently there is no thermal run-away possibility. This may allow for the use of bipolar transistors where negative thermal co-efficient had been discouraging people from using prior art paralleling technologies. Further, busbar connection may remain the same as in prior art paralleled IGBTs, except that physical symmetry of the busbar is no longer important.

Figure 2A:
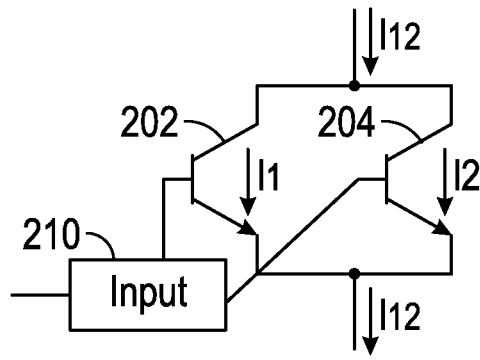
FIGS. 2A and 2B show, respectively, paralleled IGBT's and a timing diagram of how such IGBT's may be operated according to one embodiment.
Figure 2B:
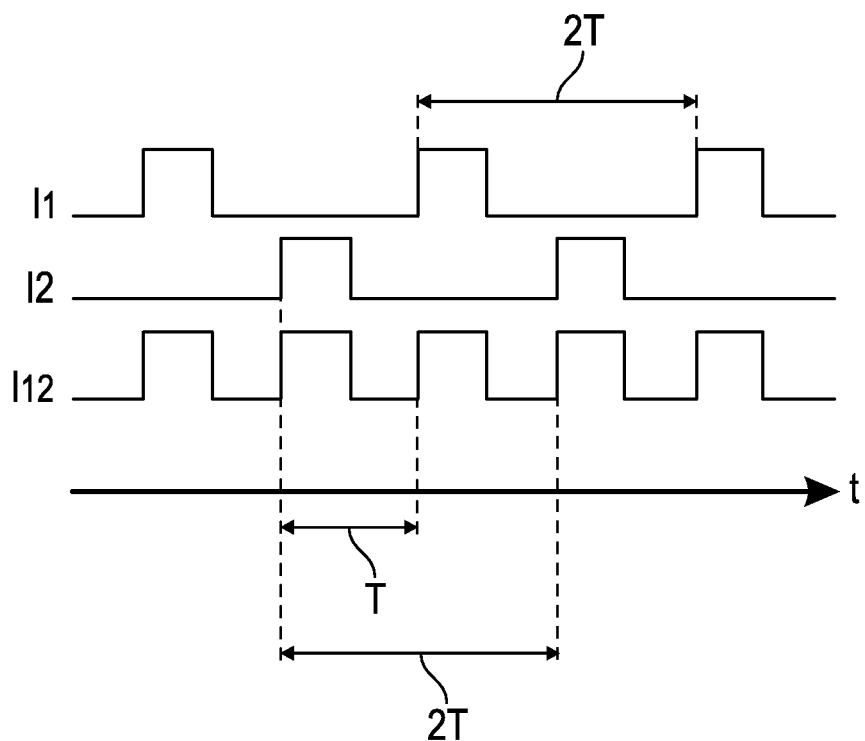

FIGS. 2A and 2B show, respectively, an ideal pair of paralleled IGBTs 202, 204 and a timing diagram showing the current through each transistor as well as when that current flows. The time the current flows (e.g., peaks 206) corresponds to when the gate of each IGBT is receiving a sufficiently high "turn-on" voltage. When current is not flowing (e.g., the troughs 208), the current is roughly zero.

In the disclosed example, the relative size of the currents $I_1$ and $I_2$ to $I_{12}$ indicate that $I_{12}$ is equal to either $I_1$ or $I_2$. In this example, each IGBT passes the entire current $I_{12}$ but only once every two periods.

In more detail, the IGBT's 202/204 are turned "on" alternately in each period T and which one is on alternates every period. Thus, for a given frequency, each IGBT is on half as often as in the prior art. In more detail, as each IGBT is on every other gate pulses, each IGBT would be carrying the total current (I) but for only half of on-time (t-on/2), and at half of the switching frequency (f/2), then each IGBT would still generate half of the total conduction losses and switching losses.

Figure 3:
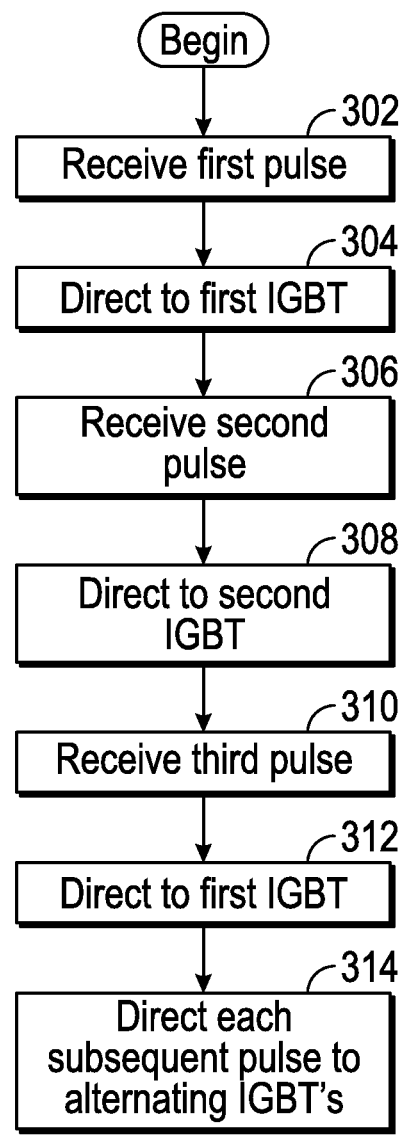
FIG. 3 is a flow chart of a method of operating paralleled IGBT's according to one embodiment.

FIG. 3 shows a flow chart of an example of how a paralleled pair of IGBT's (e.g., 202/204) may be operated. In this example, it shall be assumed that the paralleled pair of IGBT's 202/204 is receiving an input pulse for its operation as either a single phase inverter or as part for multiphase inverter.

At block 302 a first pulse is received at an input to the paralleled IGBT pair. The pair is generally shown as element 210 in FIG. 2A. It shall be understood that the input 210 may be specific element added to a system of an already operating inverter or it may be implemented as logic in the inverter operation commands.

Regardless, the first pulse is then directed to the gate of the first IGBT 202 by the input controller 201 at block 304. During that time, all of the input current $I_{12}$ passes through IGBT 202. Thus, $I_1$ equals $I_{12}$ which equals $I_{12}$ (assuming that IGBT 204 does not allow for any leakage current). In this example, the frequency of the pulses is the same as the frequency of the steps in the $I_{12}$ current shown in FIG. 2B.

At block 306 a second pulse is received and at block 308 the second pulse is then directed to the gate of the second IGBT 204 by the input controller 201. During that time, all of the input current $I_{12}$ passes through IGBT 204. Thus, $I_2$ equals $I_{12}$ which equals $I_{12}$ (again, assuming that IGBT 202 does not allow for any leakage current).

At block 310 a third pulse is received and at block 312 the third pulse is then directed to the gate of the first IGBT 202 by the input controller 201. This process may be repeated with the received pulse being alternately provided to the first and second IGBT's 202/204 as indicated at block 314.

Figure 4:
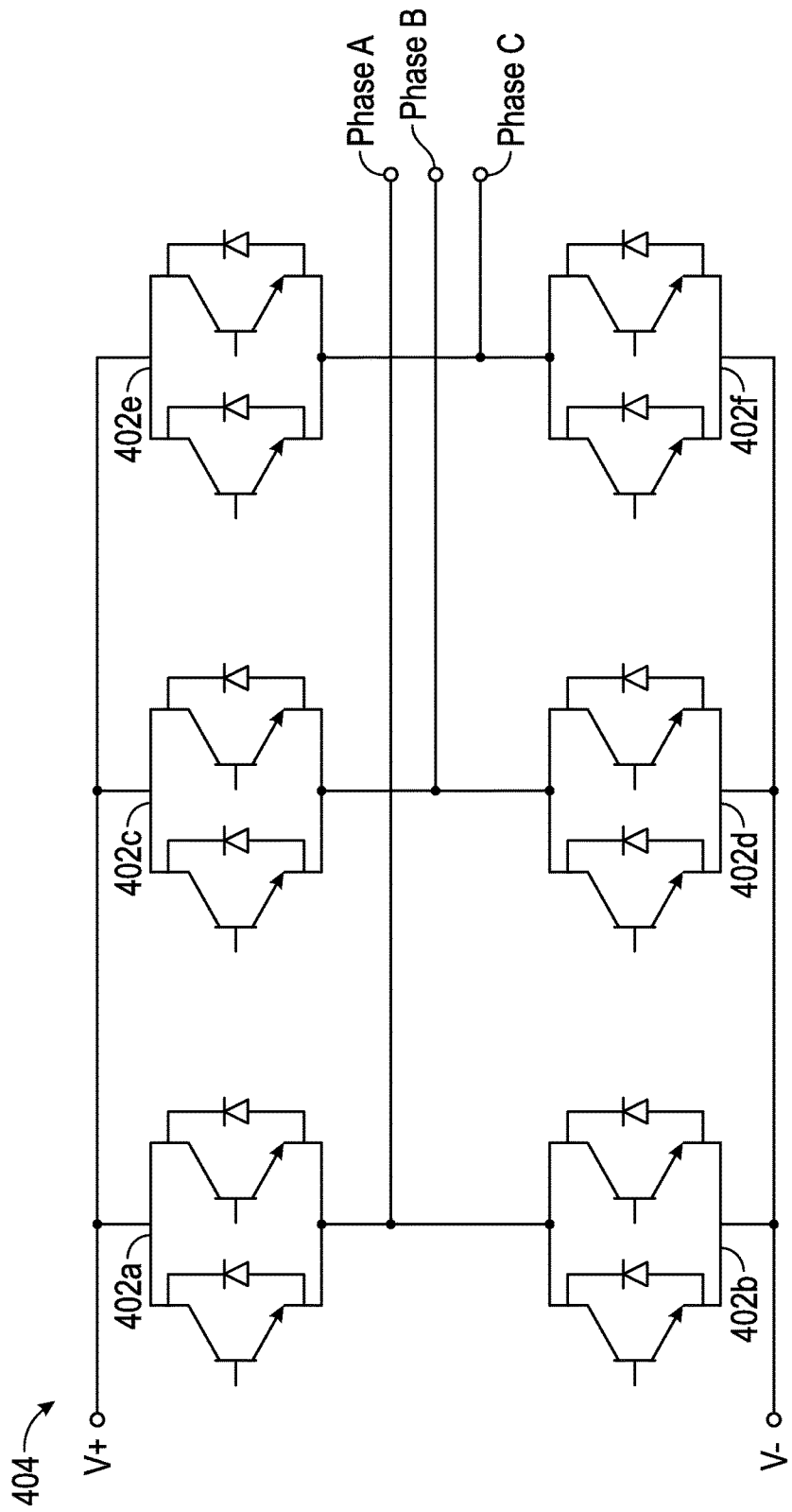
FIG. 4 shows one embodiment using six sets of paralleled IGBT's with the alternate switching of this invention to provide three phase AC output power to a load such as a motor.

FIG. 4 shows an example of 6 paralleled IGBT units 402a-402f. The six units are arranged to form a three phase inverter 404. Each is operated in the manner as described above. Each time a particular IGBT unit 402 receives a pulse, the particular IGBT in the unit that is activated alternates. In this example, units 402a and 402b provide power for phase A, 402c and 402d provide power for phase B, and 402e and 402F provide power for phase C. Each phase receives pulses that are 120 degrees separated from the any adjacent phase. In operation, the sequencing of each pair of units will be the same as the case where non-parallel transistors are used.

As an alternative, instead of providing individual units, two parallel inventers 510/512 could be used. For example, and referring to FIG. 5, two inverters 502 and 504 are provided. In this example, the "first" IGBT of a pair of parallel connected IGBT's is given an "a" designation and the second is given a "b" designation. For instance, as one or ordinary skill in the art will realize, the IGBT's 506a and 506b are wired in parallel as are IGBT's 508a and 508b. The combination of these IGBT's 506a/506b and 508a/508b drive phase A.

As yet another alternative, two parallel inverter 610/612 could be tied together through IPTs (Inter Phase Transformers) 620, 622 and 624 to improve diode current sharing and Inverter inter-leaving. In more detail, two inverters 610 and 612 are provided. In this example, the "first" IGBT of a pair of parallel connected IGBT's is given an "a" designation and the second is given a "b" designation. For instance, as one or ordinary skill in the art will realize, the IGBT's 606a and 606b are wired in parallel as are IGBT's 608a and 608b. The combination of these IGBT's 606a/606b and 608a/608b drive phase A where the mid-points (630, 632) between elements 606/608 are coupled to together by the IPT 620.

Figure 5:
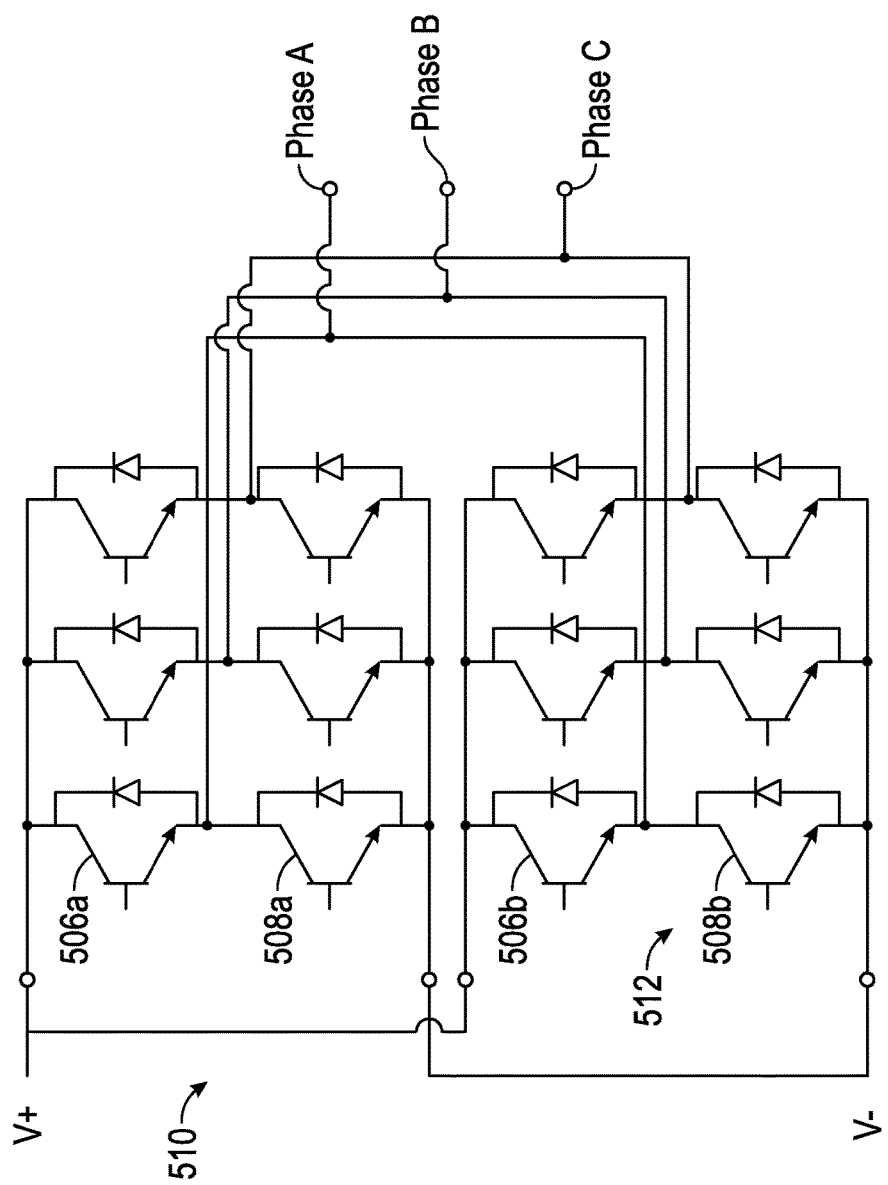
FIG. 5 shows another embodiment using two sets of six IGBT's arranged as two modular inverters to provide three phase AC power where each of the individual IGBT's of a set is contained in a different module.
Figure 6:
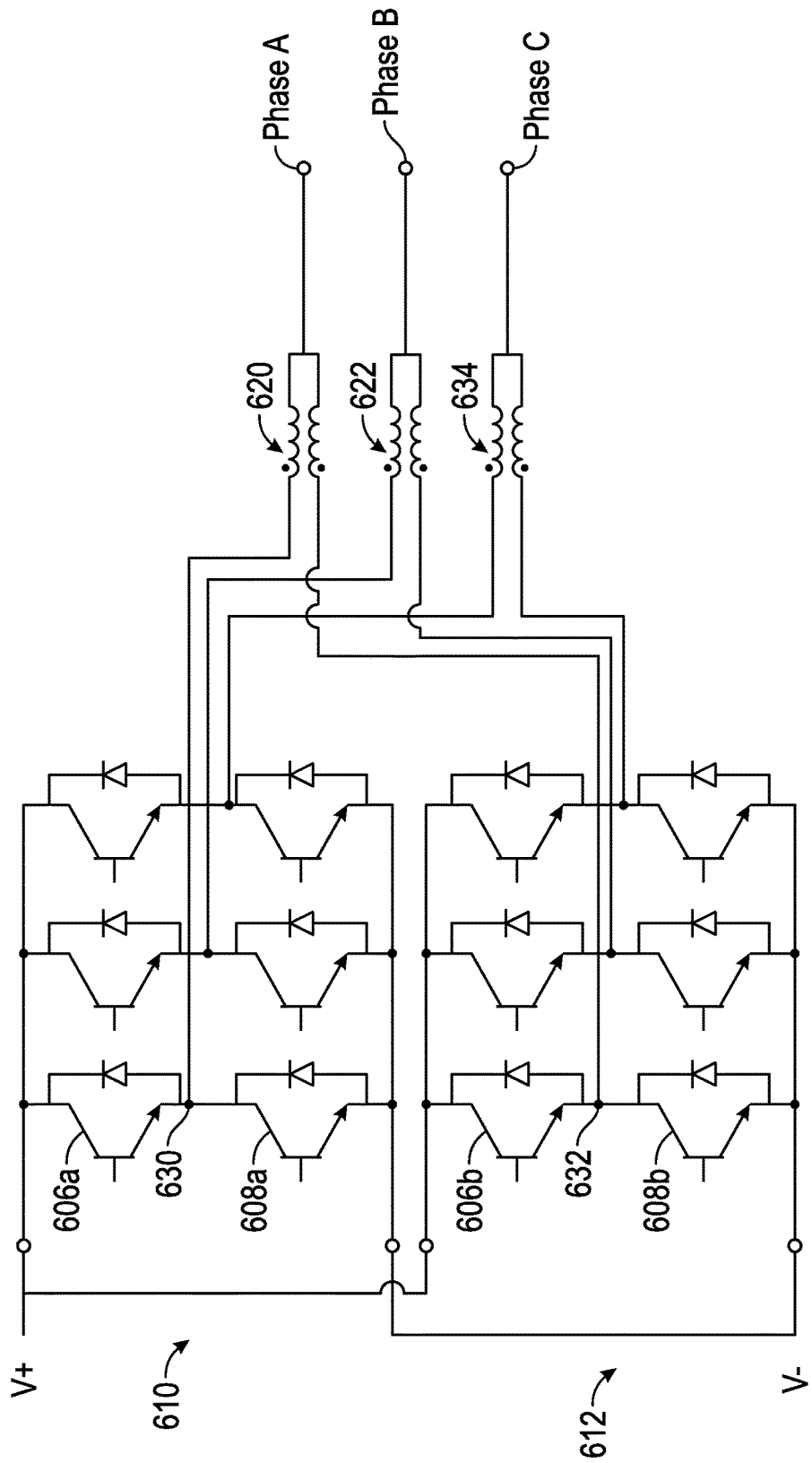
FIG. 6 shows yet another embodiment using two sets of six IGBT modular inverters connected together through IPTs (Inter Phase Transformers) to provide three phase AC power output where the IPTs allows better Diode current sharing and more freedom in control including Inter-Leaving Control.

It shall be understood that each pair of IGBT's receives the alternating gate signals as described above. In each of FIGS. 4, 5 and 6, optional diodes may be connected across the collector and emitter if needed/desired. As shown in FIGS. 4, 5 and 6, each leg of the inverter is connected between power and return of a D.C. voltage source. The source could be a battery, a generator, a D.C. bus or the like.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An inverter comprising:
    at least six sets of transistors including a first set and a second set, each set of transistors including a first transistor connected in parallel with a second transistor by coupling a collector of the first transistor to a collector of the second transistor and an emitter of the first transistor to an emitter of the second transistor, the first set having the collectors of the first and second transistors connected to an input line adapted for connection to a DC voltage source and the first and second emitters connected to a phase output line, the second set having the collectors of the first and second transistors connected to the a phase output line and their emitters connected to a DC voltage return line adapted for connection to the direct current voltage source; and
    a controller that:
    receives for the first set a first pulse and provides it for a first time period to a gate of a the first transistor of the first set and not to the second transistor of the first set and that receives a second pulse for the first set and provides it for a second time period to a gate of the second transistor of the first set and not to the first transistor of the first set; and
    receives for the second set a first pulse and provides it for a third time period to a gate of a first transistor of the second set and not to a second transistor of the second set and that receives a second pulse for the second set and provides it for a fourth time period to a gate of the second transistor of the second set and not to the first transistor of the second set.

2. The inverter of claim 1, wherein the controller further:
    receives for the first set a third pulse and provides it for the first time period to the gate of the first transistor of the first set and not to the second transistor of the first set and that receives a fourth pulse for the first set and provides it for the second time period to the gate of the second transistor of the first set and not to the first transistor of the first set.

3. The inverter of claim 1, wherein the wherein the first transistor of the first set is contained in a first inverter unit and the second transistor of the first set is contained in a second inverter unit connected in parallel with the first inverter unit between the input line and the DC voltage return line.

4. The inverter of claim 1, wherein transistors forming the first and second transistors are insulated-gate bipolar transistors, bipolar transistors, or field effect transistors.

5. The inverter of claim 1, wherein the at least six sets transistors includes a third set connected in parallel to the first set and a fourth set connected in parallel to the second set.

6. The inverter of claim 5, wherein the third and fourth sets receive pulses that are 120 degrees out of phase from the pulses received by the first and second sets.

7. A motor controller for controlling operation of a motor comprising:
    at least six sets of transistors including a first set and a second set, each set of transistors including a first transistor connected in parallel with second transistor by coupling a collector of the first transistor to a collector of the second transistor and an emitter of the first transistor to an emitter of the second transistor, the first set having the collectors of the first and second transistors connected to an input line adapted for connection to a DC voltage source and the first and second emitters connected to a phase output line, the second set having the collectors of the first and second transistors connected to the phase output line and their emitters connected to a DC voltage return line adapted for connection to the direct current voltage source;
    output lines connecting the transistors to the motor; and
    a controller that:
    receives for the first set a first pulse and provides it for a first time period to a gate of the first transistor of the first set and not to the second transistor of the first set and that receives a second pulse for the first set and provides it for a second time period to a gate of the second transistor of the first set and not to the first transistor of the first set; and
    receives for the second set a first pulse and provides it for a third time period to a gate of a first transistor of the second set and not to a second transistor of the second set and that receives a second pulse for the second set and provides it for a fourth time period to a gate of the second transistor of the second set and not to the first transistor of the second set.

8. The motor controller of claim 7, wherein the controller further:

receives for the first set a third pulse and provides it for the first time period to the gate of a first transistor of the first set and not to the second transistor of the first set and that receives a fourth pulse for the first set and provides it for the second time period to the gate of the second transistor of the first set and not to the first transistor of the first set.

9. The motor controller of claim 7, wherein the wherein the first transistor of the first set is contained in a first inverter unit and the second transistor of the first set is contained in a second inverter unit connected in parallel with the first inverter unit between the input line and the DC power return line.

10. The motor controller of claim 7, wherein transistors forming the at least six sets of transistors are insulated-gate bipolar transistors, bipolar transistors, or field effect transistors.

11. The motor controller of claim 7, wherein the second time period is equal in duration to the first time period.

12. The motor controller of claim 11, wherein the fourth time period is equal in duration to the third time period.

\* \* \* \* \*